United States Patent [19]

Smith et al.

[11] Patent Number: 5,534,788
[45] Date of Patent: Jul. 9, 1996

[54] INTEGRATED RESISTOR FOR SENSING ELECTRICAL PARAMETERS

[75] Inventors: Gregory J. Smith; David J. Kunst, both of Tucson, Ariz.

[73] Assignee: National Semiconductor Corporation, Santa Clara, Calif.

[21] Appl. No.: 352,481

[22] Filed: Dec. 9, 1994

[51] Int. Cl.⁶ .................................................. G01R 31/36
[52] U.S. Cl. ........................... 324/771; 327/537; 174/260
[58] Field of Search .................................... 324/771, 537, 324/721, 754; 174/260

[56] References Cited

U.S. PATENT DOCUMENTS

| | | |
|---|---|---|
| 4,054,814 | 10/1977 | Fegley et al. . |
| 4,217,544 | 8/1980 | Schmidt .................................. 324/721 |
| 4,246,786 | 1/1981 | Wiemer et al. . |
| 4,314,225 | 2/1982 | Tominaga et al. . |
| 4,484,213 | 11/1984 | Franklin . |
| 4,818,895 | 4/1989 | Kaufman . |
| 4,926,542 | 5/1990 | Bougger . |
| 5,204,554 | 4/1993 | Ohannes et al. . |
| 5,229,640 | 7/1993 | Pak . |
| 5,267,379 | 12/1993 | Pak . |
| 5,274,351 | 12/1993 | Lee . |

*Primary Examiner*—Kenneth A. Wieder
*Assistant Examiner*—Kourosh Cyrus Khosravi
*Attorney, Agent, or Firm*—Skjerven, Morrill, MacPherson, Franklin & Friel

[57] ABSTRACT

A leadframe for sensing electrical parameters in an integrated circuit package includes an interconnect pattern having a plurality of patterned conductive pads connected to a plurality of leads for connecting to an integrated circuit and a resistor which is integral with the leadframe and connects selected conductive pads to form a resistive connection between two of the leads.

31 Claims, 6 Drawing Sheets

INTEGRATED RESISTOR FOR SENSING ELECTRICAL PARAMETERS

BACKGROUND OF THE INVENTION

1. Field of the Invention

The invention relates to electrical circuit assemblies and, more particularly, to electrical circuit assemblies which supply a resistor for measuring electrical parameters.

2. Description of Related Art

Battery powered electronic devices often include electronics for monitoring the current of the battery cell. Excessive current in either of the charging or discharging directions can damage the cells or compromise the safety of the device. One technique for monitoring cell current entails connecting a sense resistor between the positive and negative terminals of the battery cells in series with a load or charging element. A discrete sense resistor having a low resistance, for example less than 1 ohm, causes only a small voltage drop in the total cell voltage so that cell current is measured without affecting the device operations. Unfortunately, a sense resistor having suitable accuracy is bulky and expensive. Furthermore, such a sense resistor has a high temperature coefficient so that typical variations in operating temperature result in unacceptable fluctuations in cell current measurements.

To avoid the disadvantages of measurement circuits incorporating a sense resistor, some designers have utilized a conducting MOSFET in series between the battery cells to serve as a resistor as well as a disconnect switch. However, disadvantages arise in a MOSFET implementation due to the great lot-to-lot, temperature and gate drive variability of MOSFET devices.

SUMMARY OF THE INVENTION

In the present invention, a sense resistor is integrated into an integrated circuit package as a part of the leadframe assembly, thereby advantageously reducing the size and expense of the current-sensing circuit. Furthermore, such an integrated sense resistor has an improved accuracy, a capability of safely conducting relatively high integrated circuit currents (e.g. up to 40A) and improved temperature stability in comparison to standard resistors.

The present invention includes an integrated circuit which compensates for measurement fluctuations caused by temperature variations arising from the temperature coefficient of the resistor. The integrated circuit includes sensing electronics having a temperature compensation capability.

This and other advantages are achieved in a first embodiment, a leadframe for sensing electrical parameters in an integrated circuit package. The leadframe includes an interconnect pattern having a plurality of patterned conductive pads connected to a plurality of leads for coupling to an integrated circuit and having a resistor which couples selected conductive pads to form a resistive connection between two of the leads.

In a second embodiment of the invention, an apparatus for sensing electrical parameters in an integrated circuit package includes a leadframe, an interconnect pattern which is integral with the leadframe and has a plurality of patterned conductive pads connected to a plurality of leads for connecting to an integrated circuit. The apparatus also includes a resistor which connects selected conductive pads to form a resistive connection between two of the leads.

In a third embodiment of the present invention, an electronic circuit component includes a leadframe having a generally planar top portion and having, integral to the generally planar top portion, a conductive interconnect pattern including a plurality of interconnect segments for connecting to leads of an integrated circuit. The electronic circuit component also includes a resistor which connects selected interconnect segments to form a resistive connection between two of the leads.

BRIEF DESCRIPTION OF THE DRAWINGS

In the figures, in which like reference characters indicate like parts.

DETAILED DESCRIPTION OF THE PREFERRED EMBODIMENT

Figure 1:
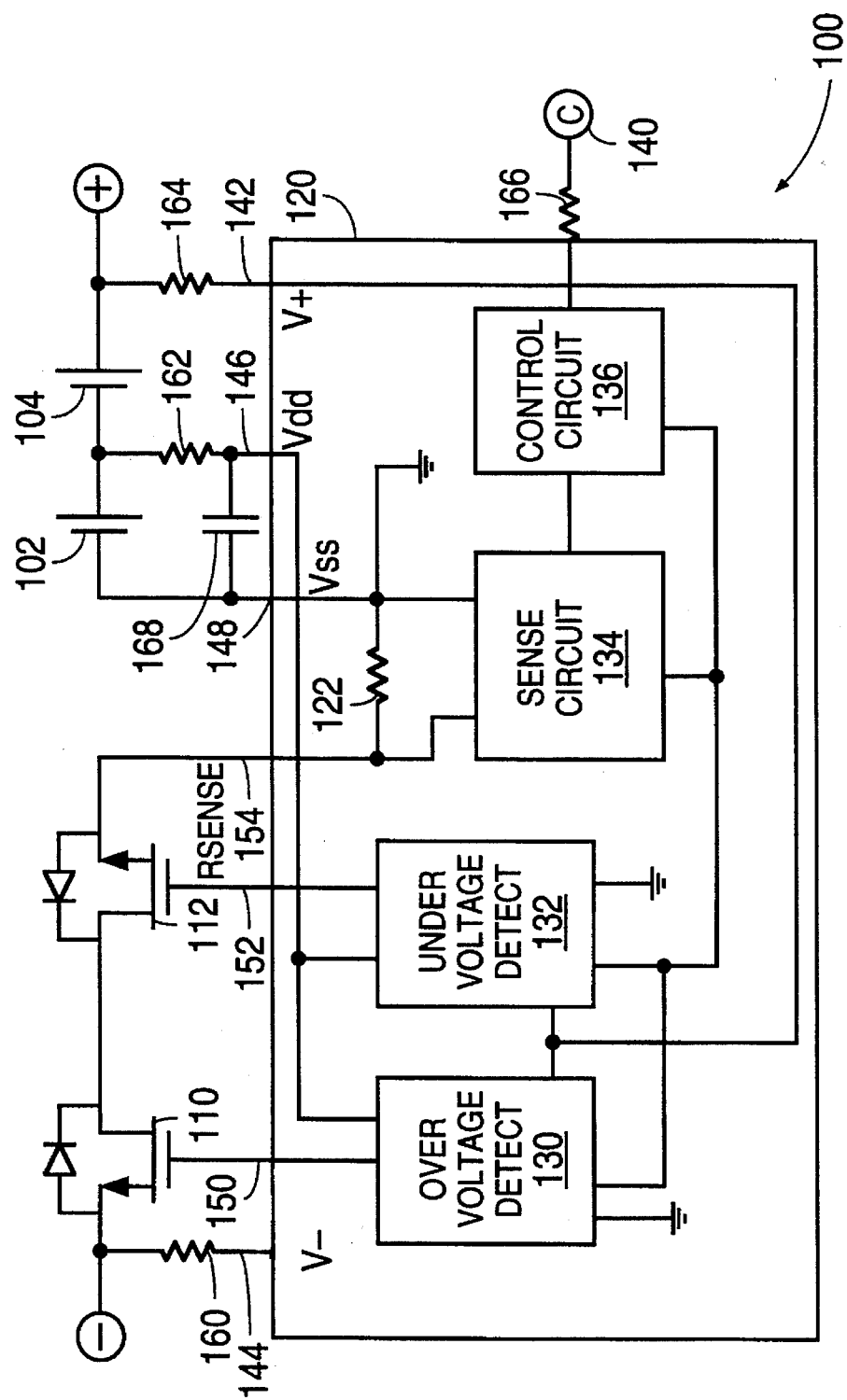
FIG. 1 illustrates a schematic diagram of a circuit which incorporates an integrated resistor for sensing electrical parameters.

FIG. 1 illustrates a schematic diagram of a circuit which incorporates an integrated resistor for sensing electrical parameters. The illustrative circuit is a lithium-ion battery pack 100. Lithium-ion battery pack 100 includes a lithium battery protection and charge control integrated circuit 120, battery cells 102 and 104 which are illustratively series-connected cells. Alternatively, parallel combinations of series cells are utilized for battery cells. Lithium-ion battery pack 100 also includes a pair of power N-channel MOSFETs 110 and 112—an overvoltage MOSFET 110 and an undervoltage MOSFET 112 which are connected in series with the battery cells 102 and MOSFETs 110 and 112 are selected to achieve predefined specifications. For example, two NDS8410 N-channel D-MOSFETs (9A, 15 MOhm $R_{DS(ON)}$, 20 V, 8 pin SOIC) are utilized in an application which specifies up to 5.5A of continuous cell current. For up to 3.3A continuous cell current, NDS8936 N-channel D-MOSFETs (5A, 30 MOhm $R_{DS(ON)}$, 20 V, 8 pin SOIC) are suitable. Lithium-ion battery pack 100 also includes a printed circuit board (not shown), which is smaller than two square centimeters, four protection resistors 160, 162, 164 and 166 and one 0.1 µF bypass capacitor 168.

The lithium battery protection integrated circuit 120 includes an integrated current-sensing resistor 122. A suitable integrated current-sensing resistor 122 has a low resistance value (1–25 mOhm) and accommodates a high current (1–40A). The current-sensing resistor 122 is formed between two leads of a plastic encapsulated integrated circuit as a part of a lead frame. In an illustrative embodiment, current-sensing resistor 122 has a resistance of 5 milliohms. The current-sensing resistor has a width of approximately 8 mil. A copper current sensing resistor 122 with a 5 milliohm resistance has a length of approximately 300 mil. Resistors constructed from alloys have a shorter length. Accuracies of stamped resistors can be as good as 15%.

Lithium battery protection and charge control integrated circuit 120 includes an OV detection circuit 130 for detecting over-voltage and overcurrent charging of the cells 102 and 104 and a UV detection circuit for detecting undervoltage and overcurrent discharging of the cells 102 and 104. A sensing circuit 134 measures electrical parameters from nodes on the two sides of the current-sensing resistor 122.

An enable pin 140 is a high impedance pin connected to an enable circuit 136. Enable circuit 136 governs the operation-of OV detection circuit 130, UV detection circuit 132, sensing circuit 134 using multiple enable lines. Enable circuit 136 powers-down the lithium battery protection and charge control integrated circuit 120 when lithium-ion battery pack 100 is not in use and disables MOSFETs 110 and 112 whenever the enable signal on the enable pin 140 is floating, such as when lithium-ion battery pack 100 is disconnected from a suitable source or charger. Floating of the enable pin 140 also causes enable circuit 136 to force the lithium battery protection and charge control integrated circuit 120 into a power-down mode. Shorting of the enable pin 140 to the positive voltage terminal 142 enables all functions of the lithium battery protection and charge control integrated circuit 120. A positive voltage terminal 142 is connected to the positive terminal of the lithium-ion battery pack 100. A negative voltage terminal 144 connected to the negative terminal of the lithium-ion battery pack 100.

A VDD terminal 146 furnishes a positive supply to the lithium battery protection and charge control integrated circuit 120 and the sensing circuit 134. A VSS terminal 148 furnishes a negative supply to the lithium battery protection and charge control integrated circuit 120 and the sensing circuit 134. An overvoltage pin 150 governs gate drive to the overvoltage MOSFET 110. The OV detection circuit 130 applies drive to the gate of the overvoltage MOSFET 110 when an overvoltage condition is not present. An undervoltage pin 152 governs gate drive to the undervoltage MOSFET 112. The undervoltage MOSFET 112 receives drive, under control of UV detection circuit 132, in the absence of an undervoltage condition. An RSENSE pin 154 serves as a node for connecting to one sensing circuit 134 input terminal and for connecting to the current-sensing resistor 122.

The lithium battery protection and charge control integrated circuit 120 automatically disconnects a battery cell which is overcharged or undercharged then automatically detects appropriate battery pack conditions for reconnecting the cells.

The lithium battery protection and charge control integrated circuit 120 controls activation and deactivation of the pair of power N-channel MOSFETs 110 and 112. The pair of power N-channel MOSFETs 110 and 112 protect the battery cells 102 and 104 from electrical over-stress. Lithium battery protection and charge control integrated circuit 120 compares each cell voltage to minimum and maximum limits and monitors the bidirectional current flow in lithium-ion battery pack 100 by measuring the voltage across the current-sensing resistor 122. The current-sensing resistor 122 has a resistance of 5 mOhm, for example, and furnishes a maximum current accuracy of ±10% (i.e., 0.5A of 5A). Lithium battery protection and charge control integrated circuit 120 deactivates one of the pair of power N-channel MOSFETs 110 and 112 whenever the cell voltage falls below the minimum limit or exceeds the maximum limit. The lithium ion battery protection and charge control integrated circuit 120 does not respond to short duration surge faults.

When either of the pair of power N-channel MOSFETs 110 and 112 is deactivated, lithium battery protection and charge control integrated circuit 120 monitors the potential across both power N-channel MOSFETs 110 and 112 to determine whether the deactivated MOSFET is to be reactivated.

Lithium battery protection and charge control integrated circuit 120 also utilizes the voltage sensed across the current-sensing resistor 122 and compensates for the temperature variation of the resistor 122.

The lithium battery protection and charge control integrated circuit 120 allows charging to start even when either cell has a voltage as low as 0V.

The enable pin 140 is used to prevent accidental short-circuiting and to extend the shelf-life of lithium-ion battery pack 100.

Lithium battery protection and charge control integrated circuit 120 continuously monitors battery voltage and current in battery cells 102 and 104 by measuring the voltage across current-sensing resistor 122. In a "slow sampling" operation, lithium battery protection and charge control integrated circuit 120 samples the voltage across current-sensing resistor 122 between $t_{SLEEP}$ timing periods. During a $t_{SLEEP}$ timing period, power is removed from a precision reference source (not shown). The slow sampling operation greatly reduces the average supply current of the lithium battery protection and charge control integrated circuit 120. For example, a typical average current drain is approximately 1 μA.

Lithium battery protection and charge control integrated circuit 120 detects an overvoltage condition of battery cells 102 and 104 by comparing the measured battery voltage to a voltage VMAX, for example 4.35 V±1% (0° C. to +80° C). If the measured battery voltage of either of battery cells 102 and 104 exceeds VMAX for a longer time duration than a selected $t_{OVERVOLTAGE}$ time period, then lithium battery protection and charge control integrated circuit 120 deactivates the overvoltage MOSFET 110. The $t_{OVERVOLTAGE}$ time period is timed by counting a selected number of $t_{SLEEP}$ cycles, for example five $t_{SLEEP}$ cycles. Lithium battery protection and charge control integrated circuit 120 detects various conditions to control reactivation of overvoltage MOSFET 110. Lithium battery protection and charge control integrated circuit 120 continues to measure cell voltage and to reactivate overvoltage MOSFET 110 when the cell voltage falls below VMAX. Application of a load to lithium-ion battery pack 100 or disconnection and reconnection of the battery pack 100 are typically sufficient to reduce the cell voltage below VMAX, resulting in reactivation of overvoltage MOSFET 110.

Lithium battery protection and charge control integrated circuit 120 detects an undervoltage condition of battery cells 102 and 104 by comparing the measured battery voltage to a voltage VMIN. If the measured battery voltage of either of battery cells and 104 falls below VMIN, for example 1.8 V±4 % (0° C. to 80° C.) for a longer time duration than a selected $t_{UNDERVOLTAGE}$ time period, then lithium battery protection and charge control integrated circuit 120 deactivates the undervoltage MOSFET 112 and enters a power-down mode. The $t_{UNDERVOLTAGE}$ time period is timed by counting a selected number of $t_{SLEEP}$ cycles, for example five $t_{SLEEP}$ cycles. Application of a charger to lithium-ion battery pack 100 or disconnection and reconnection of the battery pack 100 prompt recovery from power-down mode. In the power-down mode, a typical average current drain is approximately 200 nA.

Lithium battery protection and charge control integrated circuit 120 detects an overcurrent condition when a battery is charging by comparing a current limit $I_{MAX\text{-}CHG}$, to the actual current of the current-sensing resistor 122. If the current exceeds $I_{MAX\_CHG}$ for a longer time duration than a selected $t_{OVERCURRENT}$ time period, then lithium battery protection and charge control integrated circuit 120 deactivates the overvoltage MOSFET 110 and enters the power-down mode. Lithium battery protection and charge control integrated circuit 120 also detects an overcurrent condition when a battery is discharging by comparing a current limit $I_{MAX\text{-}DIS}$, to the current of the current-sensing resistor 122. If the current exceeds $I_{MAX\_DIX}$ for a longer time duration than a selected $t_{OVERCURRENT}$ time period, then lithium battery protection and charge control integrated circuit 120 deactivates the undervoltage MOSFET 112 and enters the power-down mode. Disconnection and reconnection of the battery pack 100 from an applied charger or load achieves recovery from power-down mode to conduction mode.

When overvoltage MOSFET 110 is deactivated, lithium battery protection and charge control integrated circuit 120 monitors the potential across both power N-channel MOSFETs 110 and 112 to determine whether a load has been applied to lithium-ion battery pack 100. If so, overvoltage MOSFET 110 is reactivated.

When undervoltage MOSFET 112 is deactivated, lithium battery protection and charge control integrated circuit 120 monitors the potential across both power N-channel MOSFETs 110 and 112 to determine whether a charger has been applied to lithium-ion battery pack 100. If so, undervoltage MOSFET 112 is reactivated.

Figure 2:
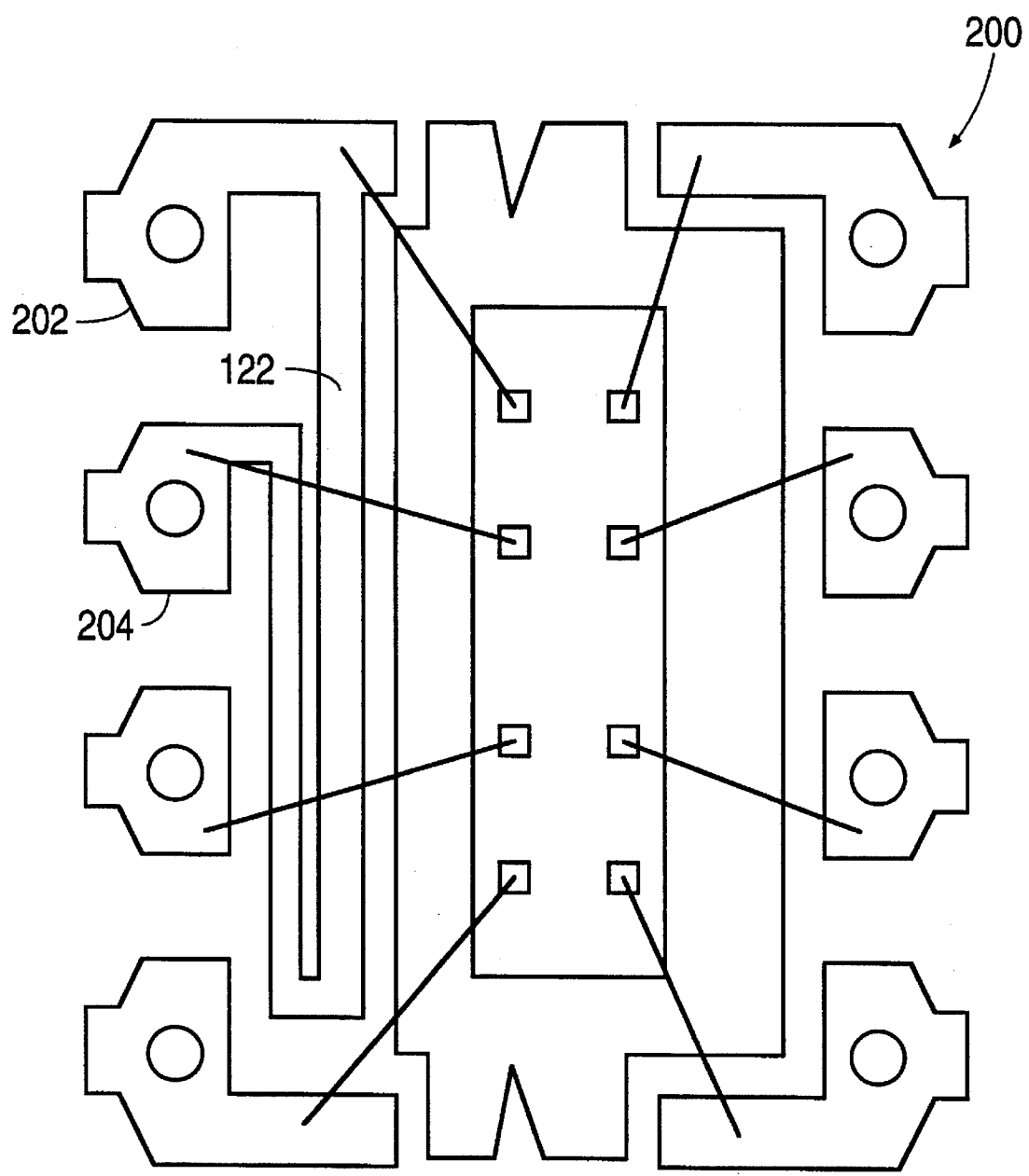
FIG. 2 shows a first embodiment of an interconnect pattern of a current-sensing resistor.

In an embodiment illustrated in FIG. 2, the current-sensing resistor 122 is formed as part of the process of forming the interconnect pattern of a leadframe 200. Thus, current-sensing resistor 122 is formed as a patterned conductive pad which electrically connects selected conductive pads 202 and 204, which in turn are connected to integrated circuit leads. The metal sheet which makes up the interconnects is formed and patterned by stamping. Patterned conductive pads 202 and 204 are attached to leads of lithium battery protection and charge control integrated circuit 120 (not shown in FIG. 2). The current-sensing resistor 122 is patterned from the metal sheet to interconnect conductive pads 202 and 204 that are connected to two of the integrated circuit leads. To achieve a suitable resistance, a current-sensing resistor 122 formed from the metal sheet generally has an extended length and small width. One technique for achieving a suitable resistance involves forming the resistor 122 in a long and thin serpentine pattern.

Figure 3:
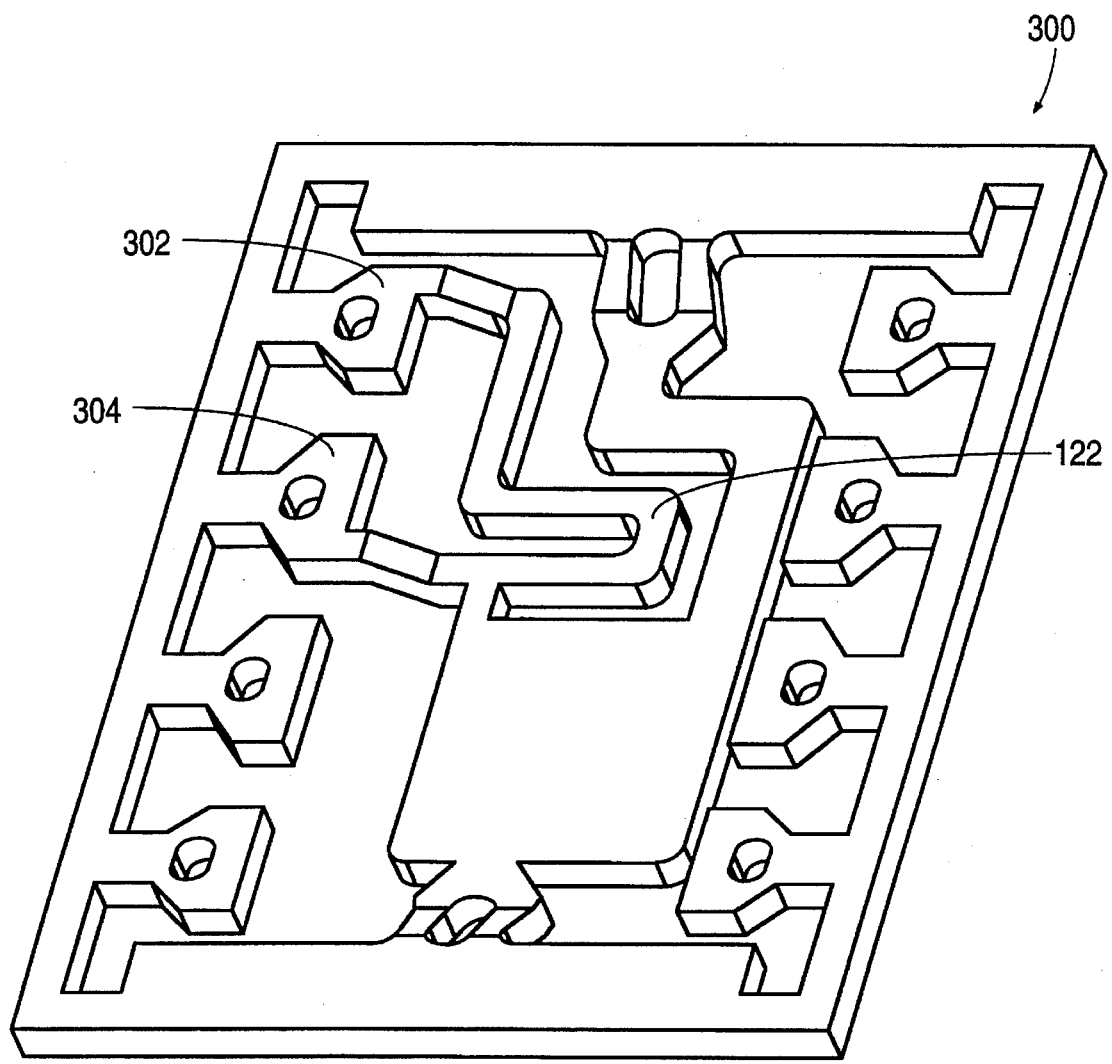
FIG. 3 depicts a second embodiment of an interconnect pattern of a current-sensing resistor.

In alternative embodiments, the shape and size of the current-sensing resistor 122 is varied to achieve a selected resistance and current-carrying capacity. One such alternative embodiment is illustrated in FIG. 3 in which a leadframe 300 has multiple interconnect segments forming conductive pads 302 and 304 which are connected using a current-sensing resistor 122. Similarly, the material from which the resistor 122 is constructed is varied to determine operative resistor characteristics.

Figure 4:
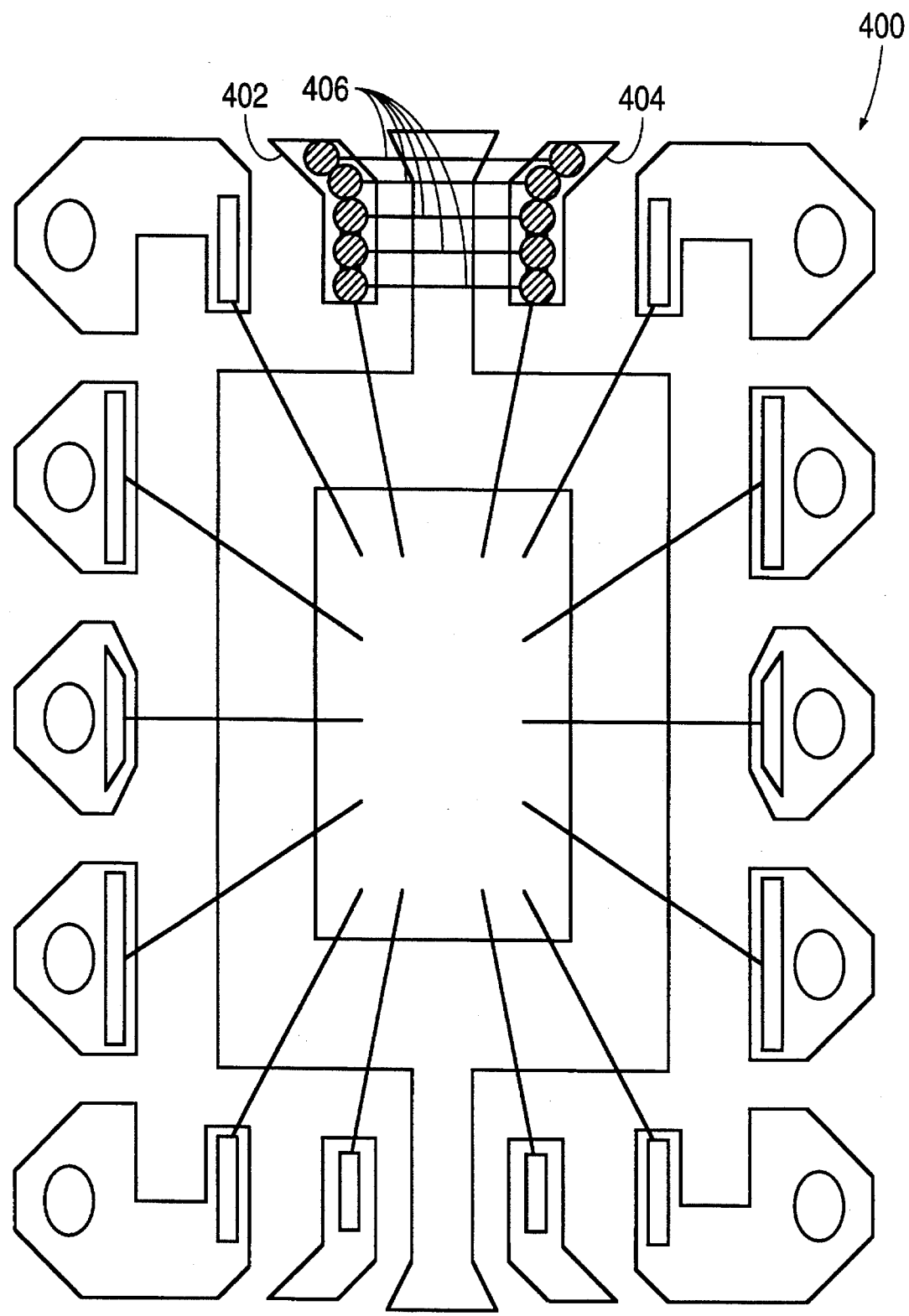
FIG. 4 illustrates an embodiment of a current-sensing transistor which is formed as multiple conductive metal wire bonds each of which forms a connection between two selected conductive pads.

In an additional embodiment, which is shown in FIG. 4, the current-sensing resistor 122 is formed as multiple conductive metal wire bonds each of which forms a connection between two selected conductive pads 402 and 404. For example, the resistor includes five substantially parallel gold wire bonds 400, each of which forms a connection between two selected conductive pads 402 and 404. To achieve a resistance of approximately 5 milliohm, five gold wires 400 have a diameter of approximately 1.5 mil and a length of approximately 50 mil is utilized. The five wires 400 can carry approximately six amperes continuously.

The lithium battery protection and charge control integrated circuit 120 includes a temperature compensation capability to adjust for differences in electrical parameters measured across the current-sensing resistor 122 due to temperature variations acting on the resistor which has a particular temperature coefficient of resistance. The temperature coefficient of resistance is the incremental change in the resistance of a material which results from a change in thermodynamic temperature.

Figure 5:
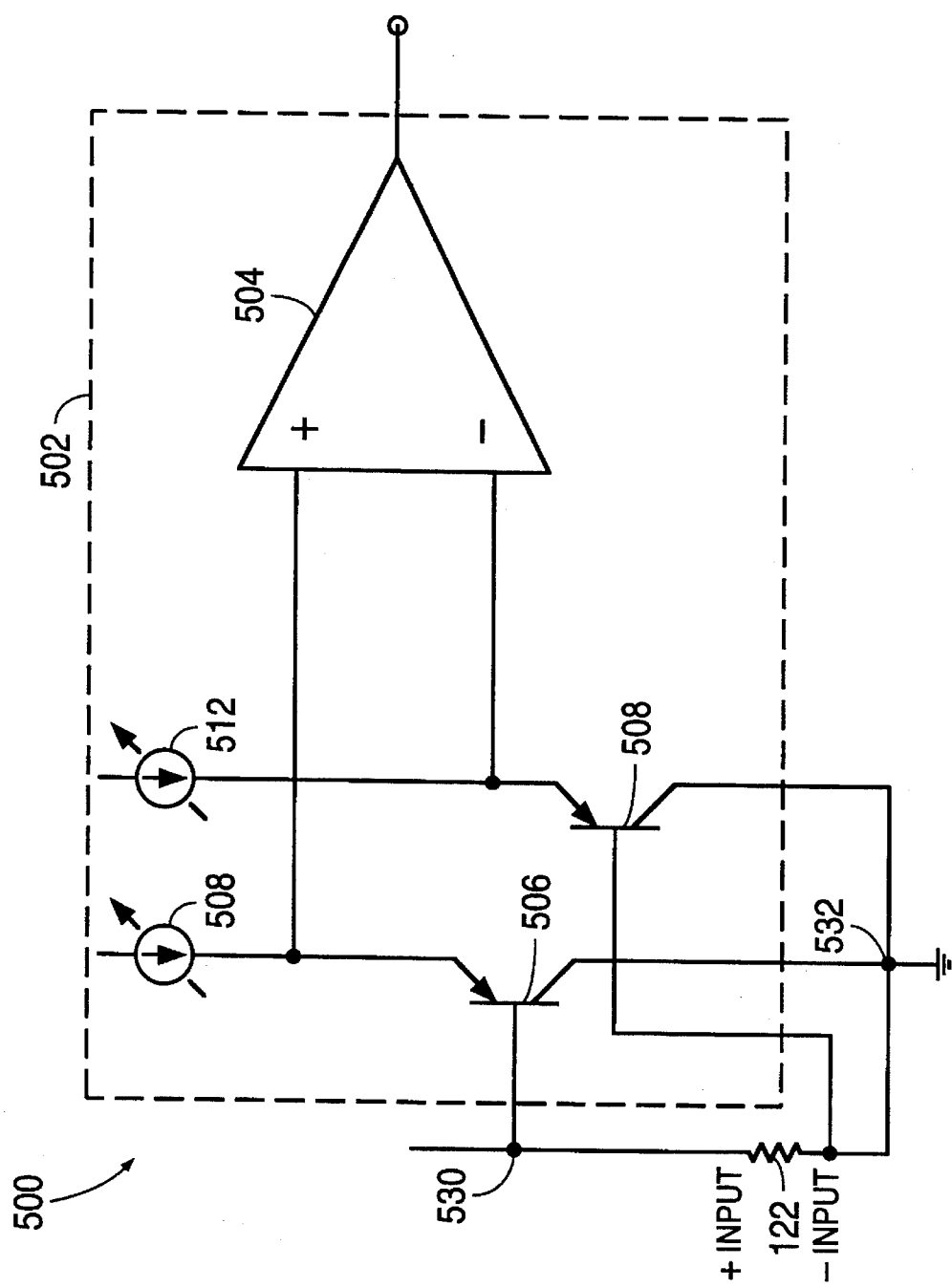
FIG. 5 shows a sense amplifier comparator circuit which includes a temperature compensation circuit.

Referring to FIG. 5, a sense amplifier comparator circuit 502 is a first illustrative embodiment 500 of a temperature compensation circuit which utilizes a parasitic PNP on N-well process. Sense amplifier comparator circuit 502 includes a comparator 504, two PNP transistors 506 and 508, and two current sources 510 and 512. PNP transistors 506 and 508 are level shifters which shift the voltage level of the signal across current sensing resistor 122 for usage by sensing and analysis circuits (not shown). PNP transistor 506 has an emitter-collector current path driven by current source 510. A base of PNP transistor 506 is connected to a node 530 on the positive pole side of the current sensing resistor 122. PNP transistor 508 has an emitter-collector current path driven by current source 512. A base of PNP transistor 508 is connected to a node 532 on the negative pole side of the current sensing resistor 122. In this illustrative embodiment 500, the emitter area of PNP transistor 506 is approximately twice the emitter area of PNP transistor 508, preferentially driving the positive terminal of comparator 504 with respect to the negative terminal.

Sense amplifier comparator circuit 502, which measures battery charging current, achieves temperature compensation by connecting a plus terminal of the comparator 504 to an emitter terminal of PNP transistor 506 and connecting a minus terminal of the comparator 504 to an emitter terminal of PNP transistor 508. In this manner, voltage shifted signals which are acquired across the current sensing resistor 122 are applied to the differential input terminals of the comparator 504.

A sense amplifier comparator circuit for measuring battery discharge current is substantially the same as sense amplifier comparator circuit 502, except that the minus terminal of the comparator 504 is connected to the emitter terminal of PNP transistor 506 and the plus terminal of the comparator 504 is connected to the emitter terminal of PNP transistor 508. Furthermore, in the sense amplifier comparator circuit for measuring discharge current, the emitter area of PNP transistor 508 is approximately twice the emitter area of PNP transistor 506, preferentially driving the positive terminal of comparator 504 with respect to the negative terminal.

Other circuitry (not shown) detects the direction of current flow through the current sensing resistor 122 and activates the sense amplifier comparator circuit 502 for measuring charge current when the battery cells 102 and 104 are charging and otherwise activates the sense amplifier comparator circuit (not shown) for measuring discharge current.

Generally undercurrent and overcurrent are detected using a comparator and a reference voltage generator to generate respective $I_{MAX\_DIS}$ and $I_{MAX\_CHG}$ references. The illustrative embodiment 500 of a temperature compensation circuit merges the comparator and reference generator elements using a comparator with an offset which is equal to a temperature compensation reference voltage.

Figure 6:
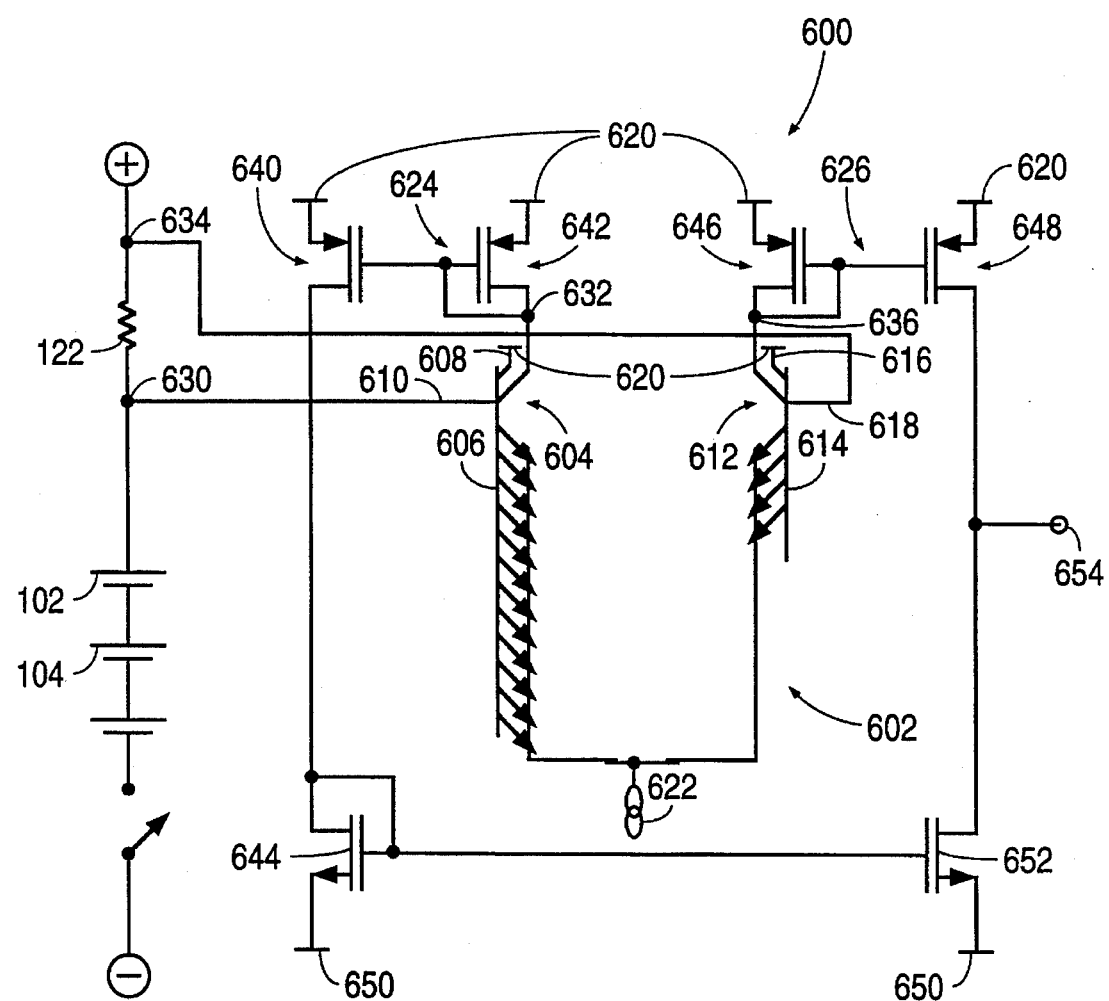
FIG. 6 shows an alternative embodiment of a sense amplifier comparator which furnishes a temperature compensation circuit.

Referring to FIG. 6, an $I_{MAX}$ charge current comparator 602 is illustrated which furnishes a second embodiment of a temperature compensation circuit, an operational transconductance amplifier (OTA) 600 which employs a parasitic NPN on P-well process. The temperature coefficient of the current-sensing resistor 122 is closely compensated by the temperature coefficient $V_{os}TC$ of the amplifier comparator circuit 502. Adjustment of the magnitude of $V_{os}$ of a comparator 602 is achieved through selection of emitter characteristics of transistors in the operational transconductance amplifier 600. The $I_{MAX}$ charge current comparator 602 includes a proportional to absolute temperature circuit (PTAT) having a first multiple-emitter transistor 604 and a second multiple-emitter transistor 612. First multiple-emitter transistor 604 has a collector terminal 608 which is connected to a reference voltage source 620, a multiple emitter terminal 606 having n emitter regions which is connected to a proportional to absolute temperature (PTAT) current source 622 and a base 610 which is connected to a node 630 on the positive pole side of the current sensing resistor 122. In the illustrative embodiment, the reference voltage source 620 is a voltage source at the top of a battery pack (e.g., the positive voltage terminal 142 shown in FIG. 1). Second multiple-emitter transistor 612 has a collector terminal 616 which is connected to the reference voltage source 620, a multiple emitter terminal 614 having m emitter regions which is connected to the PTAT current source 622 and a base 618 which is connected to a node 634 on the negative pole side of the current sensing resistor 122. The first, level shifter 624 includes P-channel MOS transistors 640 and 642, each having a source connected to the reference voltage source 620 and mutually connected gates. P-channel MOS transistor 642 is connected as a diode with its gate and drain interconnected and connected at node 632 to the collector of first multiple-emitter transistor 604. The drain of P-channel MOS transistor 640 is connected to a reference voltage source 650 through a diode-connected n-channel transistor 644. The second level shifter 626 includes P-channel MOS transistors 646 and 648, each having a source connected to. the reference voltage source 620 and mutually connected gates. P-channel MOS transistor 646 is connected as a diode with its gate and drain interconnected and connected at node 636 to the collector of second multiple-emitter transistor 612. The drain of P-channel MOS transistor 648 is connected to a reference voltage source 650 through a N-channel MOS transistor 652. Current is measured at a node 654 between the drain of P-channel MOS transistor 648 and the drain of N-channel MOS transistor 652. The PTAT current source 622 supplies a very low current and P-channel MOS transistors 640, 642, 646 and 648 are wide-channel transistors first and second multiple-emitter transistors 604 and 614 are kept out of saturation. In an alternative embodiment, the voltage applied to the bases of first and second multiple-emitter transistors 604 and 614 is level-shifted down using respective emitter followers (not shown).

The $I_{MAX}$ charge current comparator 602 is controlled to compensate for the temperature coefficient of the current-sensing resistor 122, $TC_{RES}$. For example, a current sensing resistor 122 constructed from copper typically has a temperature coefficient, $TC_{RES-Cu}$, of approximately 3800 ppm/° C. Similarly, a current sensing resistor 122 constructed from a suitable Nickel alloy has a temperature coefficient, $TC_{RES-Ni}$, of approximately 3300 ppm/° C. The temperature coefficient of input offset voltage $V_{os}$ of amplifier comparator circuit 502 is approximately 3333 ppm/° C. PTAT. The ratio n/m is selected to set a suitable comparator trip point for the current flowing through current sensing resistor 122.

To measure battery discharge current, an $I_{MAX}$ discharge current comparator (not shown) is furnished which is substantially identical to $I_{MAX}$ charge current comparator 602 except that the base 610 of first multiple-emitter transistor 604 is connected to node 630 on the negative pole side of the current sensing resistor 122 and the base 618 of second multiple-emitter transistor 606 is connected to node 634 on the positive pole side of the current sensing resistor 122.

While the invention has been described with reference to various embodiments, it will be understood that these embodiments are illustrative and that the scope of the invention is not limited to them. Variations, modifications, additions and improvements of the embodiments described are possible. For example, other applications of the leadframe current sensing resistor utilize linear transformation of current signals to either voltage level signals or ADC output signals. Wideband current to voltage conversion is useful in electric motor control and monitoring. These and other variations, modifications, additions and improvements may fall within the scope of the invention as defined in the claims which follow.

We claim:

1. An apparatus for sensing electrical parameters in an integrated circuit package comprising:

a leadframe;

an interconnect pattern integral with the leadframe including a plurality of patterned conductive pads connected to a plurality of leads for coupling to an integrated circuit;

a resistor coupling with selected conductive pads forming a resistive coupling between two of the leads;

a measurement circuit coupled to the interconnect pattern leads to measure electrical parameters across the resistor: and a temperature compensation circuit to compensate for variations in the sensed electrical parameters measured across the resistor resulting from temperature variations.

2. An apparatus as in claim 1, wherein the temperature compensation circuit further comprises:

a comparator having an inverted input terminal coupled to a first side of the resistor and having a noninverted input terminal coupled to a second side of the resistor.

3. An apparatus for sensing electrical parameters in an integrated circuit package comprising;

a lead frame;

an interconnect pattern integral with the lead frame including a plurality of patterned conductive pads connected to a plurality of leads for coupling to an integrated circuit;

a resistor coupling with selected conductive pads forming a resistive coupling between two of the leads;

a measurement circuit coupled to the interconnect pattern leads to measure electrical parameters across the resistor; and a temperature compensation circuit to compensate for variations in the sensed electrical parameters measured across the resistor resulting from temperature variations, the temperature compensation circuit including:

a comparator having an inverted input terminal coupled to a first side of the resistor and having a noninverted input terminal coupled to a second side of the resistor; and a first level shifter operating at a first current density coupled between the comparator inverted input terminal and the first side of the resistor; and a second level shifter operating at a second current density different from the first current density coupled between the comparator noninverted input terminal and the second side of the resistor.

4. An apparatus for sensing electrical parameters in an integrated circuit package comprising;

a lead frame;

an interconnect pattern integral with the lead frame including a plurality of patterned conductive pads connected to a plurality of leads for coupling to an integrated circuit;

a resistor coupling with selected conductive pads forming a resistive coupling between two of the leads;

a measurement circuit coupled to the interconnect pattern leads to measure electrical parameters across the resistor; and a temperature compensation circuit to compensate for variations in the sensed electrical parameters measured across the resistor resulting from temperature variations the temperature compensation circuit including:

a first multiple-emitter transistor having a collector terminal coupled to a reference voltage source, a multiple emitter terminal with n emitter regions coupled to a current source and a base terminal coupled to a node on a negative pole side of the current sensing resistor;

a second multiple-emitter transistor having a collector terminal coupled to the reference voltage source, a multiple emitter terminal with m emitter regions coupled to the current source and a base terminal coupled to a node on a positive pole side of the current sensing resistor.

5. An apparatus as in claim 4, wherein the temperature compensation circuit is adjusted by selecting a current density ratio which determines a temperature coefficient.

6. An apparatus as in claim 4, wherein the temperature compensation circuit further comprises:

a first level shifter operating at a first current density coupled to the base terminal of the first multiple-emitter transistor; and a second level shifter operating at a second current density different from the first current density coupled to the base terminal of the second multiple-emitter transistor.

7. An apparatus as in claim 4 wherein the measurement circuit measures current flow in the resistor.

8. An apparatus as in claim 7 further comprising a control circuit coupled to the measurement circuit for comparing a current measurement to a preselected threshold current value and for selectively disconnecting power to the apparatus in accordance with the comparison result.

9. An apparatus as in claim 4 wherein the measurement circuit measures voltage across the resistor.

10. An apparatus as in claim 9 further comprising a control circuit coupled to the measurement circuit for comparing a voltage measurement to a preselected threshold voltage value and for selectively disconnecting power to the apparatus in accordance with the comparison result.

11. An electronic circuit component comprising:

a leadframe having a generally planar top portion and having, integral therewith, a conductive interconnect pattern including a plurality of interconnect segments for coupling to leads of an integrated circuit; and a resistor coupling selected interconnect segments forming a resistive coupling between two of the leads;

a semiconductor chip including:

a measurement circuit coupled to the leadframe interconnect pattern for measuring electrical parameters across the resistor;

a temperature compensation circuit coupled to the measurement circuit for compensating for variations in the sensed electrical parameters measured across the resistor which result from temperature variations.

12. A component as in claim 11, wherein the temperature compensation circuit further comprises:

a comparator having an inverted input terminal coupled to a first side of the resistor and having a noninverted input terminal coupled to a second side of the resistor.

13. An electronic circuit component comprising:

a lead frame having a substantially planar top portion and having, integral therewith, a conductive interconnect pattern including a plurality of interconnect segments for coupling to leads of an integrated circuit:

a resistor coupling selected interconnect segments forming a resistive coupling between two of the leads; and a semiconductor chip coupled to the lead frame interconnect pattern including:

a measurement circuit for measuring electrical parameters across the resistor; and a temperature compensation circuit for compensating for variations in the sensed electrical parameters measured across the resistor which result from temperature variations, the temperature compensation circuit further including:

a comparator having an inverted input terminal coupled to a first side of the resistor and having a noninverted input terminal coupled to a second side of the resistor;

a first level shifter operating at a first current density coupled between the comparator inverted input terminal and the first side of the resistor; and a second level shifter operating at a second current density different from the first current density coupled between the comparator noninverted input terminal and the second side of the resistor.

14. An electronic circuit component comprising:

a lead frame having a substantially planar top portion and having, integral therewith, a conductive interconnect pattern including a plurality of interconnect segments for coupling to leads of an integrated circuit;

a resistor coupling selected interconnect segments forming a resistive coupling between two of the leads; and a semiconductor chip coupled to the lead frame interconnect pattern including:

a measurement circuit for measuring electrical parameters across the resistor: and a temperature compensation circuit for compensating for variations in the sensed electrical parameters measured across the resistor which result from temperature variations, the temperature compensation circuit further including:

a first multiple-emitter transistor having a collector terminal coupled to a reference voltage source, a multiple emitter terminal with n emitter regions coupled to a current source and a base terminal coupled to a node on a negative pole side of the current sensing resistor;

a second multiple-emitter transistor having a collector terminal coupled to the reference voltage source, a multiple emitter terminal with m emitter regions coupled to the current source and a base terminal coupled to a node on a positive pole side of the current sensing resistor.

15. A component as in claim 14, wherein the temperature compensation circuit is adjusted by selecting a current density ratio which determines a temperature coefficient.

16. An apparatus as in claim 15, wherein the temperature compensation circuit further comprises:

a first level shifter operating at a first current density coupled to the base terminal of the first multiple-emitter transistor; and a second level shifter operating at a second current density different from the first current density coupled to the base terminal of the second multiple-emitter transistor.

17. A component as in claim 14 wherein the measurement circuit measures current flow in the resistor.

18. A component as in claim 14 further comprising a control circuit coupled to the measurement circuit for comparing a current measurement to a preselected threshold current value and for selectively disconnecting power to the apparatus in accordance with the comparison result.

19. A component as in claim 14 wherein the measurement circuit measures voltage across the resistor.

20. A component as in claim 19 further comprising a control circuit coupled to the measurement circuit for comparing a voltage measurement to a preselected threshold voltage value and for selectively disconnecting power to the apparatus in accordance with the comparison result.

21. An apparatus comprising:

a battery pack for coupling a battery cell between a positive terminal and a negative terminal;

a battery protection integrated circuit coupled to the battery pack and having a connection to the positive terminal and the negative terminal; and a lead frame coupled to the battery protection integrated circuit including:
an interconnect pattern including a plurality of patterned conductive pads connected to a plurality of leads for coupling to an integrated circuit; and
a resistor coupling to selected conductive pads forming a resistive coupling between two of the leads.

22. An apparatus according to claim 21, wherein:

the battery protection integrated circuit is a plastic encapsulated integrated circuit; and the resistor is an integrated current-sensing resistor coupled between two leads of the plastic encapsulated integrated circuit.

23. An apparatus according to claim 22 wherein the integrated resistor has a resistance value which ranges from 1 to 25 milliohms and a current capacity which ranges from 1 to 40 amperes.

24. An apparatus according to claim 22 wherein the resistor is a patterned conductive pad which is coupled to selected conductive pads of the lead frame.

25. An apparatus according to claim 24 wherein the integrated resistor is a copper patterned conductive pad having a width of approximately 8 mm and a length of approximately 300 mm in a winding pattern.

26. An apparatus according to claim 21 wherein the resistor includes a plurality of conductive metal wire bonds each of which couples two selected conductive pads.

27. An apparatus according to claim 26 wherein the resistor includes five substantially parallel gold wire bonds each of which couples two selected conductive pads.

28. An apparatus according to claim 21 further comprising a measurement circuit coupled to the interconnect pattern leads to measure electrical parameters across the resistor.

29. An apparatus according to claim 28 further comprising a temperature compensation circuit to compensate for variations in the sensed electrical parameters measured across the resistor resulting from temperature variations.

30. An apparatus according to claim 29 wherein the temperature compensation circuit further comprises:

a comparator having an inverted input terminal coupled to a first side of the resistor and having a noninverted input terminal coupled to a second side of the resistor;

a first level shifter operating at a first current density coupled between the comparator inverted input terminal and the first side of the resistor; and a second level shifter operating at a second current density different from the first current density coupled between the comparator noninverted input terminal and the second side of the resistor.

31. An apparatus according to claim 29, wherein the temperature compensation circuit further comprises:

a first multiple-emitter transistor having a collector terminal coupled to a reference voltage source, a multiple emitter terminal with n emitter regions coupled to a current source and a base terminal coupled to a node on a negative pole side of the current sensing resistor;

a second multiple-emitter transistor having a collector terminal coupled to the reference voltage source, a multiple emitter terminal with m emitter regions coupled to the current source and a base terminal coupled to a node on a positive pole side of the current sensing resistor.

* * * * *

UNITED STATES PATENT AND TRADEMARK OFFICE
CERTIFICATE OF CORRECTION

PATENT NO. : 5,534,788
DATED : July 9, 1996
INVENTOR(S) : Gregory J. Smith and David J. Kunst It is certified that error appears in the above-indentified patent and that said Letters Patent is hereby corrected as shown below:

Column 12, line 7, delete "," and insert --.--.

Signed and Sealed this

Eighteenth Day of February, 1997

Attest:

BRUCE LEHMAN

*Attesting Officer*  *Commissioner of Patents and Trademarks*